(12) United States Patent
Song

(10) Patent No.: US 7,183,225 B2
(45) Date of Patent: Feb. 27, 2007

(54) METHOD FOR FABRICATING SEMICONDUCTOR DEVICE

(75) Inventor: Jung Gyun Song, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 3 days.

(21) Appl. No.: 11/027,734

(22) Filed: Dec. 28, 2004

(65) Prior Publication Data

US 2005/0142806 A1 Jun. 30, 2005

(30) Foreign Application Priority Data

Dec. 30, 2003 (KR) .................... 10-2003-0100970

(51) Int. Cl.
*H01L 21/461* (2006.01)
*H01L 21/302* (2006.01)

(52) U.S. Cl. ...................... 438/745; 438/753
(58) Field of Classification Search ...................... None
See application file for complete search history.

(56) References Cited

U.S. PATENT DOCUMENTS

| | | | | |
|---|---|---|---|---|
| 5,065,273 A | * | 11/1991 | Rajeevakumar | ............. 361/313 |
| 5,460,687 A | * | 10/1995 | Douglas | ...................... 216/48 |
| 5,520,299 A | * | 5/1996 | Belcher et al. | ............... 216/66 |
| 5,603,848 A | * | 2/1997 | Beratan et al. | ............... 216/17 |
| 5,676,760 A | * | 10/1997 | Aoki et al. | ................... 134/1.3 |
| 6,037,270 A | * | 3/2000 | Kageyama et al. | ......... 438/746 |
| 2004/0127035 A1 | * | 7/2004 | Lee | ............................ 438/689 |

\* cited by examiner

*Primary Examiner*—Duy-Vu N. Deo
(74) *Attorney, Agent, or Firm*—Andrew D. Fortney

(57) ABSTRACT

A method for fabricating a semiconductor device is disclosed. In the method, a buffer oxide film and a nitride film are formed on a semiconductor substrate in succession, an opening is formed in the nitride film and the buffer oxide film for exposing a field region of the semiconductor substrate, the expose semiconductor substrate is wet etched with dilute HF solution and irradiated with a UV beam to form a trench with rounded upper edges and lower corners. Then, an oxide film is gap filled in the trench, the oxide film is planarized, and the nitride film and the buffer oxide film are removed to expose an active region of the semiconductor substrate. The present invention can moderate field concentrations at the upper edges and lower corners of the trench, reduce a leakage current from the semiconductor device, and improve electrical characteristics and/or yield of the semiconductor device.

18 Claims, 4 Drawing Sheets

METHOD FOR FABRICATING SEMICONDUCTOR DEVICE

CROSS-REFERENCE TO RELATED APPLICATIONS

This application claims the benefit of Korean Application No. P2003-0100970 filed on Dec. 30, 2003, which is hereby incorporated by reference as if fully set forth herein.

BACKGROUND OF THE INVENTION

1. Field of the Invention

The present invention relates to methods for fabricating a semiconductor device, and more particularly, a method for fabricating a semiconductor device, in which a semiconductor substrate is etched by photochemical wet etching, to form a rounded edge of a trench.

2. Discussion of the Related Art

In general, for isolation of the semiconductor device, the LOCOS (Local Oxidation of Silicon) process has been used. Thereafter, due to drawbacks of the LOCOS process, new isolation technologies have been developed actively, of which technologies such as PBL (Poly Buffer LOCOS), R-LOCOS (Recessed LOCOS), and so on, have been widely used. Because these technologies not only have complicated processes, but also can not completely prevent a Bird's Beak phenomenon (in which a silicon oxide film encroaches into a channel region), the LOCOS-based technologies have limitations in packing semiconductor devices to a high density. Moreover, the high step that may exist between surfaces of the active region and the field region of the silicon substrate requires a subsequent planarizing step for reducing the step height of the surfaces.

Recently, an STI (Shallow Trench Isolation) process has been introduced, in which above drawbacks are improved. Because the STI process has a better device isolation characteristic and a smaller occupying area compared to the LOCOS processes, the STI process is very favorable for packing semiconductor devices to a high density.

In STI, a trench is formed in an isolation region of a silicon substrate, an oxide film is filled in the trench by gap filling, and the oxide film is polished by Chemical Mechanical Polishing (CMP), to planarize both the oxide film in the trench and the silicon substrate. According to this, the oxide film is formed in the trench in the isolation region of the silicon substrate.

As the oxide film for gap filling the trench, $O_3$-TEOS (Tetra-Ethyl-Ortho-Silicate) deposited by Atmospheric Pressure Chemical Vapor Deposition (APCVD) or by Subatmospheric Pressure Chemical Vapor Deposition (SACVD), or an oxide film formed by High Density Plasma Chemical Vapor Deposition (HDPCVD) or Plasma Enhanced Chemical Vapor Deposition (PECVD), all of which have good gap filling and planarizing characteristics, are mostly used.

In the meantime, referring to FIG. 1A, in the related art STI, for an example, a buffer oxide film 11 and a nitride film 13 are formed on an entire surface of a semiconductor substrate 10, such as a single crystal silicon substrate, in succession. Then, a photoresist film PR pattern is formed on the nitride film 13 for exposing the nitride film 13 on the field region of the semiconductor substrate 10. The nitride film 13 and the buffer oxide film 11 are subjected to dry etching using the photoresist film PR pattern as an etch mask layer, to form an opening 14 which exposes a surface of the field region of the semiconductor substrate 10.

Referring to FIG. 1B, the semiconductor substrate 10 at the opening 14 is subjected to dry etching by using the photoresist film PR pattern as an etch mask layer, to form a trench 15.

Referring to FIG. 1C, after removal of the photoresist film PR pattern in FIG. 1B, an etched surface of the trench 15 is subjected to thermal oxidation to form an oxide film 17 for reducing etch damage to the etched surface of the trench 15.

Referring to FIG. 1D, an insulating film having a good gap filling property is filled in the trench 15, and subjected to chemical mechanical polishing until the oxide film 19 is flush with the nitride film 13.

Referring to FIG. 1E, the nitride film 13 is etched by phosphoric acid solution, to expose the buffer oxide film 11. The buffer oxide film 11 is etched by hydrofluoric acid solution, to expose a surface of the active region of the semiconductor substrate 10. Thus, the STI process is finished.

In the meantime, because upper edges and lower corners of the trench 15 may be sharp, the oxide film 17 is sometimes used or formed on the etched surface of the trench 15 for moderating the sharp edges and the corners. However, since the upper edges and the lower corners of the trench 15 may still be sharp or otherwise fail to form a round shape, field concentrations may result in the regions of the substrate at or near the upper edges and the lower corners. As a result of the field concentration, a leakage current from the trench 15 may increase, thereby adversely electric characteristics and/or yield of the semiconductor device.

SUMMARY OF THE INVENTION

Accordingly, the present invention is directed to a method for fabricating a semiconductor device that substantially obviates one or more problems due to limitations and disadvantages of the related art.

An object of the present invention is to provide a method for fabricating a semiconductor device, in which upper edges and lower corners of a STI trench are rounded, to moderate field concentration at the upper edges and the lower corners of the trench.

Another object of the present invention is to provide a method for fabricating a semiconductor device, in which a leakage current from a trench is reduced, to improve electric characteristics and yield of a semiconductor device.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a semiconductor device includes the steps of forming an etch mask layer on a semiconductor substrate, the etch mask layer having an opening for exposing a field region of the semiconductor substrate; wet etching the semiconductor substrate exposed in the opening with a etch solution to form a recess with round corners, and irradiating the semiconductor substrate exposed in the opening during wet etching to form a trench with rounded upper edges and lower corners.

Preferably, the semiconductor substrate may be wet etched with dilute HF solution. The HF solution may have a $H_2O$:HF ratio of equal to or about 4:1.

Preferably, the light used during the irradiating step may be a UV beam. The UV beam may have an energy greater than an energy forbidden band of the semiconductor substrate (e.g., as characterized by the corresponding light wavelengths). The UV beam may have a wavelength below 400 nm, when the semiconductor substrate is a silicon substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A~2E illustrate sections showing the steps of a Shallow Trench Isolation in accordance with a preferred embodiment of the present invention, applied to a method for fabricating a semiconductor device.

Figure 2A:
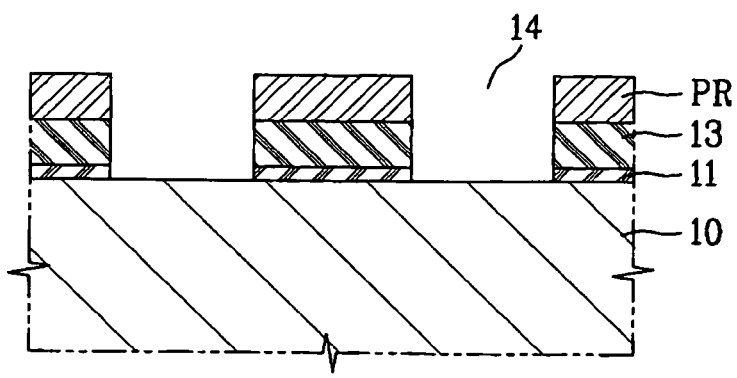
FIGS. 2A~2E illustrate sections showing the steps of a Shallow Trench Isolation in accordance with a preferred embodiment of the present invention, applied to a method for fabricating a semiconductor device.

Referring to FIG. 2A, a sacrificial film is formed on a surface of a semiconductor substrate 10, such as a single crystal silicon substrate. In more detail, a buffer oxide film 11 is formed on the surface of the semiconductor substrate 10 to a thickness of 40 Å~150 Å, and a nitride film 13 is formed on the buffer oxide film 11 to a thickness of 600 Å~1500 Å by using, for example, low pressure chemical vapor deposition. The buffer oxide film 11 is formed for moderating stress on the semiconductor substrate 10 exerted by the nitride film 13. The nitride film 13 serves as an etch mask layer in formation of the trench 15, as well as an etch or polish stop film in a subsequent Chemical Mechanical Polishing (CMP) step.

Then, a photoresist film pattern PR is formed on the nitride film 13 for exposing the nitride film 13 in the field region of the semiconductor substrate 10. The nitride film 13 and the buffer oxide film 11 are removed by dry etching using the patterned photoresist film PR as an etch mask layer, to form an opening 14 exposing a surface of the field region of the semiconductor substrate 10.

Figure 2B:
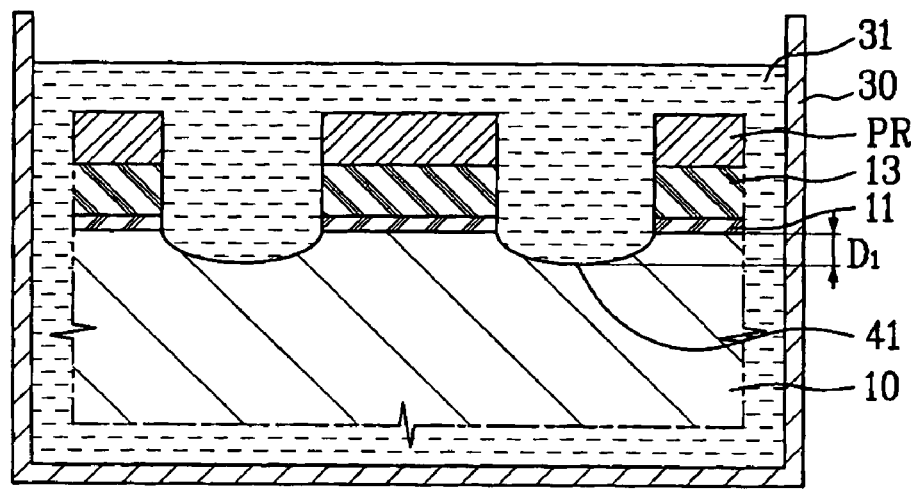

Referring to FIG. 2B, the semiconductor substrate 10 is placed in an etch bath 30 containing an etch solution 31 (such as dilute HF) at a room temperature. Etch solution 31 generally has an isotropic etch characteristic. Wet etching is carried out (initially, in the absence of applied UV radiation) until the semiconductor substrate 10 is etched to a desired depth D1, to form a recess 41 in a field region of the semiconductor substrate 10. Since the etch rate for a given wet etchant and a given substrate is generally known, the first, recess-forming phase of the wet etch step can be conducted for a predetermined period of time corresponding to and/or resulting in the recess having a predetermined depth D1. The dilute HF solution may have a $H_2O$:HF ratio of equal to or about 4:1 by weight, and may further comprise $H_2O_2$ in an amount about equal to the amount of HF.

In this instance, since the semiconductor substrate 10 is etched isotropically, the recess 41 generally has rounded corners at the bottom, and may have a rounded shape, such as a semicircular or semi-oval shape, different from the sharp corners at the bottom which generally result from anisotropic (dry) etching. However, the upper edges of the recess 31 are generally still sharp in this stage of wet etching.

Figure 2C:
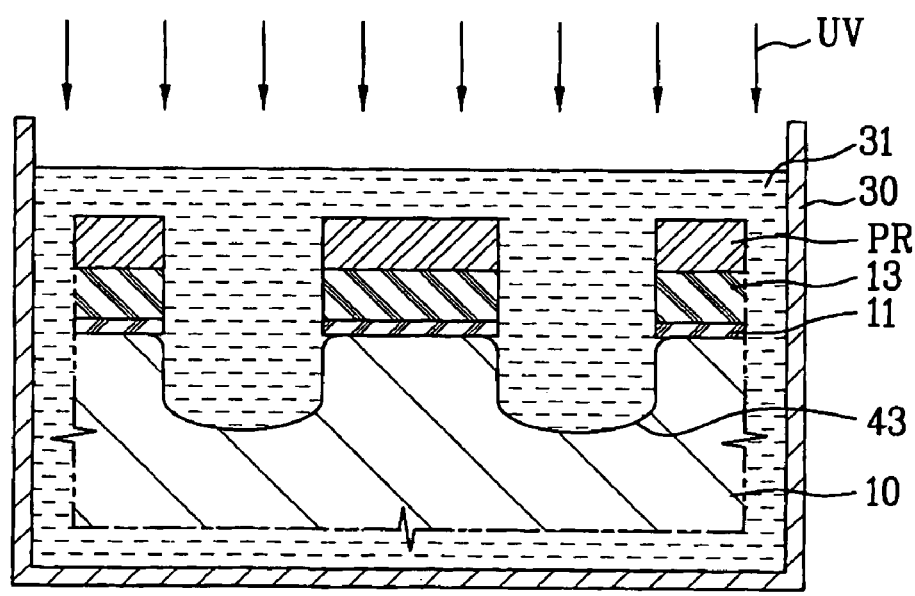

Referring to FIG. 2C, the semiconductor substrate 10 is irradiated with a light (for example, an ultraviolet (UV) beam from a conventional mercury [Hg] arc lamp) in the HF solution 31, in a second phase to wet etch the semiconductor substrate 10 photochemically to a desired or predetermined depth, to form a trench 43.

An energy E of the UV beam is given as $E=h\nu=h/\lambda$, where $\nu$ denotes frequency, and $\lambda$ denotes a wavelength of the UV beam. When the semiconductor substrate 10 comprises a single crystal silicon substrate, because an energy forbidden band in such silicon generally has a width of 2.1 eV of energy, it is required to have a wavelength $\lambda$ of below 400 nm for the UV beam to have an energy greater than 2.1 eV.

Therefore, when a UV beam having a wavelength below 400 nm is applied to the semiconductor substrate 10, an electron in a valence band of the silicon of the semiconductor substrate 10 may obtain sufficient energy to overcome the forbidden band and be excited to a conduction band, to form a hole in the valence band. Thus, the silicon atoms of the semiconductor substrate 10 may be activated and become more reactive with the HF solution, enabling etching of the semiconductor substrate 10 at a faster or higher rate. For example, the etch rate during photochemical wet etching may be up to about 100 times higher than the etch rate during the initial wet etching phase. Thus, one may also conduct photochemical wet etching for a predetermined period of time corresponding to and/or resulting in the trench having a predetermined or target depth. Also, the depth D1 of recess 41 (see FIG. 2B) may be only from about 5% to 20% of the depth of trench 43 (see FIG. 2C). In one implementation, recess depth D1 is <10% of the depth of trench 43.

Figure 1A:
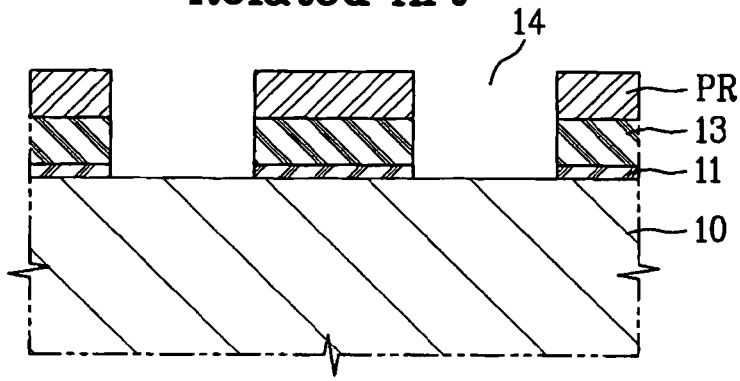
FIGS. 1A~1E illustrate sections showing the steps of a conventional Shallow Trench Isolation.
Figure 1B:
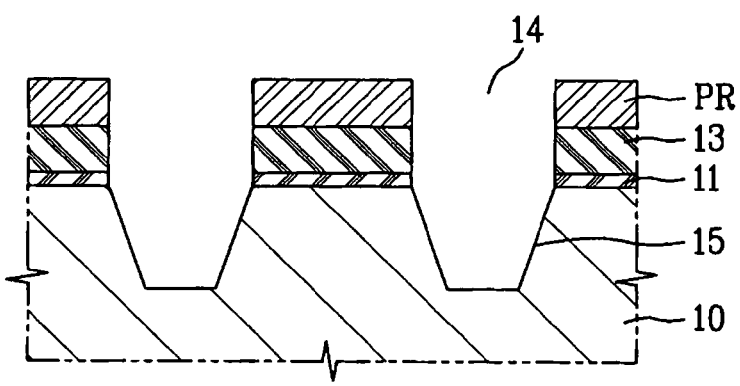
Figure 1C:
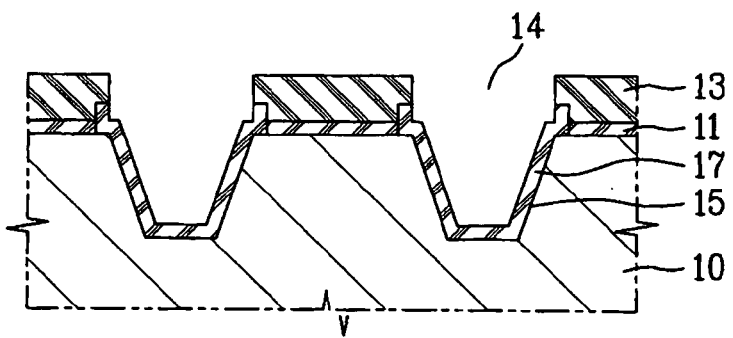
Figure 1D:
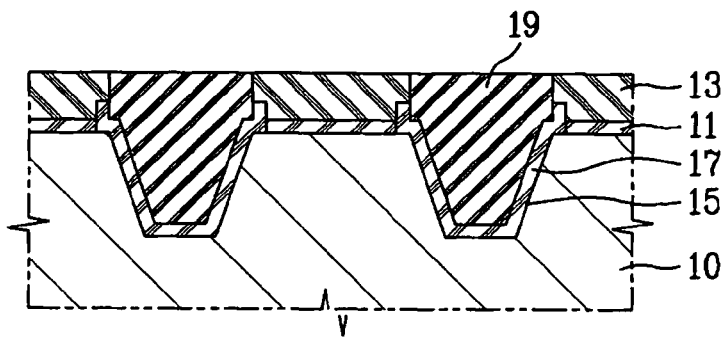
Figure 1E:
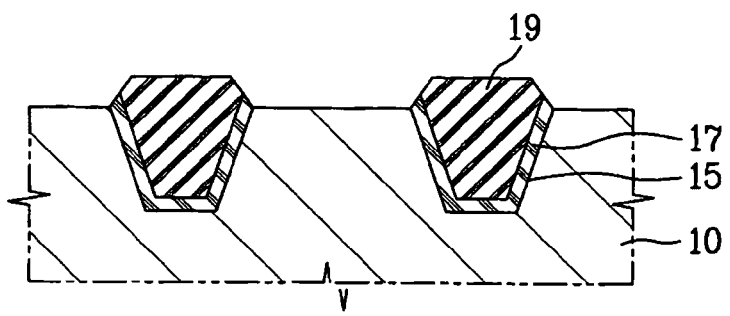

As the upper edges of the recess are etched and removed by the etch solution 31, the upper edges of the trench 43 are rounded. Since the lower corners of the recess are rounded, to form, for an example, a semicircular or semioval shape, in the step of FIG. 2B, the lower corners of the trench 43 remain round. Because the upper edges and the lower corners of the trench 43 are round, the present invention can omit the thermal oxidation for forming the oxide film 17 on an inside of the trench 15 as shown in FIG. 1C. Moreover, since the present invention can reduce a leakage current from the trench 43, and improve electrical characteristics of the semiconductor device, yield of the semiconductor device can be improved.

Figure 2D:
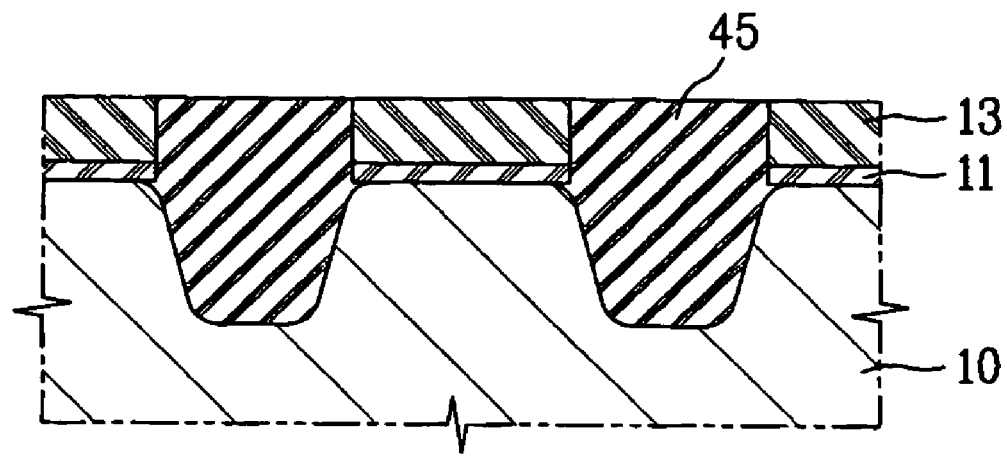

Referring to FIG. 2D, the semiconductor substrate 10 is taken out of the etch solution 31 in FIG. 2C, and washed with pure water, such as deionized water. Then, the photoresist PR pattern is removed, and a thick oxide film 45 comprising O3-TEOS is formed in the trench 43 and on the nitride film 13 by APCVD or SACVD, to make gap filling in the trench 43. Instead of APCVD or SACVD, the oxide film 45 may comprise a high density oxide film formed by PECVD or HDPCVD.

Thereafter, the oxide film 45 in the trench 43 may be densified by, for example, high temperature heat treatment (e.g., annealing), and the oxide film 45 may be made flush (e.g., coplanar) with the nitride film 13 by a planarizing process, such as chemical mechanical polishing, to remove all the oxide film 45 on the nitride film 13, and leave only the oxide film 45 in the trench 43. In this instance, the nitride film 13 serves as an etch or polish stop film for the chemical mechanical polishing process.

Figure 2E:
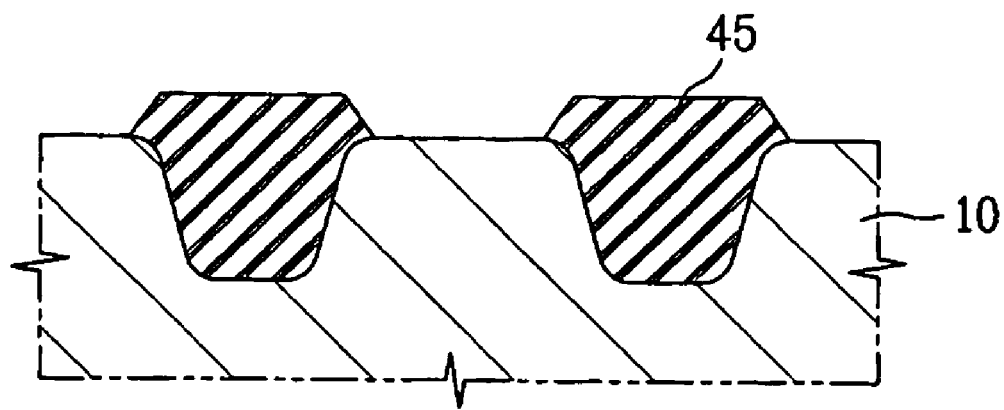

Referring to FIG. 2E, in order to lower a surface of the oxide film 45 (e.g., reduce its step height), the oxide film 45 is wet etched to a desired or predetermined thickness with hydrofluoric acid solution, and the nitride film 13 is etched with phosphoric acid solution to expose the buffer oxide film 11 beneath the nitride film 13. Next, the buffer oxide film 11 is etched with hydrofluoric acid, to expose a surface of the active region of the semiconductor substrate 10. Thus, the STI process of the present invention is completed.

By rounding the upper edges and the lower corners of the STI trench, the present invention can moderate field concentrations in the substrate at or near the upper edges and the lower corners. As a result of this, the leakage current from the trench is reduced, leading to improved electric characteristics and improve yield of the semiconductor device.

As has been described, in the present method for fabricating a semiconductor device, a buffer oxide film and a nitride film are formed on a semiconductor substrate in succession, an opening is formed in the nitride film and the buffer oxide film for exposing a field region of the semiconductor substrate, the field region of the semiconductor substrate is wet etched (e.g., with dilute HF solution) and the semiconductor substrate is irradiated (e.g., with a UV beam) during at least part of the wet etching to form a trench. Then, an oxide film is deposited in the trench, the oxide film is planarized, and the nitride film and the buffer oxide film are removed to expose an active region of the semiconductor substrate.

Accordingly, since the present invention can form rounded upper edges and lower corners of the trench, field concentrations in the substrate at or near the upper edges and lower corners of the trench can be moderated, a leakage current from the semiconductor device can be reduced, and electrical characteristics of the semiconductor device can be improved. As a result of this, the present invention can improve yield of the semiconductor device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device, comprising the steps of:
    forming an etch mask layer on a semiconductor substrate, the etch mask layer having an opening for exposing a field region of the semiconductor substrate;
    wet etching the semiconductor substrate in the opening with an etch solution comprising dilute HF and $H_2O_2$, using the etch musk layer as an etch mask to form a recess; and
    irradiating the semiconductor substrate in the opening during the wet etching to form a trench with rounded upper edges and lower corners.

2. The method as claimed in claim 1, wherein the dilute HF has a $H_2O$:HF ratio of equal to or about 4:1.

3. The method as claimed in claim 2, wherein the amount of $H_2O_2$ is about equal to the amount of dilute HF.

4. The method as claimed in claim 1, wherein the semiconductor substrate is irradiated with a UV beam.

5. The method as claimed in claim 4, wherein the UV beam has an energy greater than an energy forbidden band of the semiconductor substrate.

6. The method as claimed in claim 5, wherein the semiconductor substrate comprises a silicon substrate, and the UV beam has a wavelength below 400 nm.

7. The method of claim 1, further comprising forming a buffer oxide film an the surface of the semiconductor substrate.

8. The method of claim 7, wherein the buffer oxide film has a thickness of from about 40 Å to 150 Å.

9. The method of claim 1, wherein the etch mask layer comprises a nitride layer.

10. The method of claim 9, wherein the etch mask layer has a thickness of from about 600 Å to 1500 Å.

11. The method of claim 1, further comprising forming a photoresist film pattern on the etch mask layer.

12. The method of claim 11, wherein the photoresist film pattern is also used as an etch mask in the wet etching step.

13. The method of claim 1, wherein wet etching the semiconductor substrate is carried out until the semiconductor substrate is etched to a desired depth.

14. The method of claim 1, wherein irradiating the semiconductor substrate is carried out until the semiconductor substrate is etched to a desired depth to form a trench.

15. The method of claim 1, wherein the recess is formed, then the semiconductor substrate is irradiated.

16. The method of claim 1 wherein the recess has a depth of from about 5% to 20% of the depth of the trench.

17. The method of claim 16, wherein the depth of the recess is less than 10% of the depth of the trench.

18. The method as claimed in claim 1, wherein the amount of $H_2O_2$ is about equal to the amount of dilute HF.

* * * * *